(12) United States Patent
Panikkath et al.

(10) Patent No.: US 6,975,150 B2
(45) Date of Patent: Dec. 13, 2005

(54) APPARATUS AND METHODS TO CONTROL LASER DUTY CYCLE

(75) Inventors: Vinod V. Panikkath, Tarzana, CA (US); Georgios Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 10/608,331

(22) Filed: Jun. 27, 2003

(65) Prior Publication Data

US 2004/0264522 A1 Dec. 30, 2004

(51) Int. Cl.$^7$ ............................................... H03K 3/17
(52) U.S. Cl. ...................................... 327/175; 327/172
(58) Field of Search ................................ 327/172–175, 327/156, 158, 159; 331/57, 17, 25

(56) References Cited

U.S. PATENT DOCUMENTS

| | | | |
|---|---|---|---|
| 4,962,323 A * | 10/1990 | Ta ................................. | 327/97 |
| 5,695,494 A * | 12/1997 | Becker .......................... | 606/33 |
| 6,417,715 B2 * | 7/2002 | Hamamoto et al. .......... | 327/291 |
| 6,580,305 B1 * | 6/2003 | Liu et al. ..................... | 327/298 |
| 2002/0140477 A1 * | 10/2002 | Zhou et al. .................. | 327/175 |

* cited by examiner

*Primary Examiner*—Timothy P. Callahan
*Assistant Examiner*—An T. Luu
(74) *Attorney, Agent, or Firm*—Hanley, Flight & Zimmerman, LLC

(57) ABSTRACT

Apparatus and methods to control laser duty cycle are disclosed. According to one example, a driver circuit may include a duty cycle adjustment circuit, an output stage configured to receive an input signal having a duty cycle and a replica output stage configured to receive the input signal and to produce an output signal that is coupled to a duty cycle adjustment circuit. In such an arrangement, the duty cycle adjustment circuit is configured to affect the duty cycle of the input signal.

18 Claims, 2 Drawing Sheets

-PRIOR ARTns US 6,975,150 B2

APPARATUS AND METHODS TO CONTROL LASER DUTY CYCLE

TECHINCAL FIELD

The present disclosure pertains to driver circuits and, more particularly, to apparatus and methods to control laser duty cycle.

BACKGROUND

Laser driver circuits, which are typically used to drive laser diodes, vertical cavity surface emitting lasers (VCSELs) and/or physical media dependent (PMD) lasers, include duty cycle adjustment (DCA) functionality implemented in hardware, circuits and/or software. The DCA functionality enables adjustment of the duty cycle, or equivalently the eye crossing pattern of signals output from a laser driver circuit.

One type of known DCA arrangement includes open loop control of the driver duty cycle (i.e., the arrangement does not include a feedback path). However, as readily appreciated by those having ordinary skill in the art, open loop control systems may not control the driver duty cycle as accurately as desired.

Closed loop control is another known DCA arrangement. One type of closed loop DCA includes a feedback tapped directly from an output driver stage that is coupled to the laser. However, such an arrangement is only useful when a laser is alternating current (AC) coupled to the output of the driver (e.g., the driver output is coupled to the laser through a capacitor) and when the driver includes an on-chip termination.

Systems including lasers that are directly coupled (i.e., not AC coupled) may use a closed loop DCA, such as that shown in a known driver system 100 of FIG. 1. The known driver system 100 includes first and second driver stages 102, 104 that are cascaded to an output stage 106. An input signal is provided to the first driver stage 102 and a driving signal is produced by the output stage 106 and is directly coupled to a laser 108 and a termination 110. The driver system 100 includes a DCA circuit 112 that receives a signal from the output of the second driver stage 104 and produces an output that is coupled to the input of the first driver stage 102. The first and second driver stages 102, 104, the output stage 106 and the DCA circuit 112 are disposed on a chip 114 on which the laser 108 and the termination 110 are not located. Accordingly, the laser 108 and the termination 110 are referred to as being located "off-chip."

The driver system 100 of FIG. 1 derives feedback from the output of the second driver stage 104. This is necessary because the output stage 106 is directly coupled to the laser 108 and the termination 110 and, therefore, the differential signals produced by the output stage 106 are asymmetrical because one of the output signals is coupled to the laser 108, which may be capacitive or inductive in nature, and the other output signal is coupled to the termination 110, which is not capacitive or inductive. Asymmetrical signals cannot be used as feedback signals to the DCA circuit 112. Accordingly, to ensure symmetry of the feedback signal, the output of the second driver stage 104 is used to generator feedback. However, a significant drawback of using the output of the second driver stage 104 as a source of feedback is that any offset in duty cycle introduced by the output stage 106 cannot be compensated for by the DCA circuit 112 because the feedback signal does not include any such offset, thereby adversely affecting the duty cycle control of the system 100.

DETAILED DESCRIPTION

Figure 1:
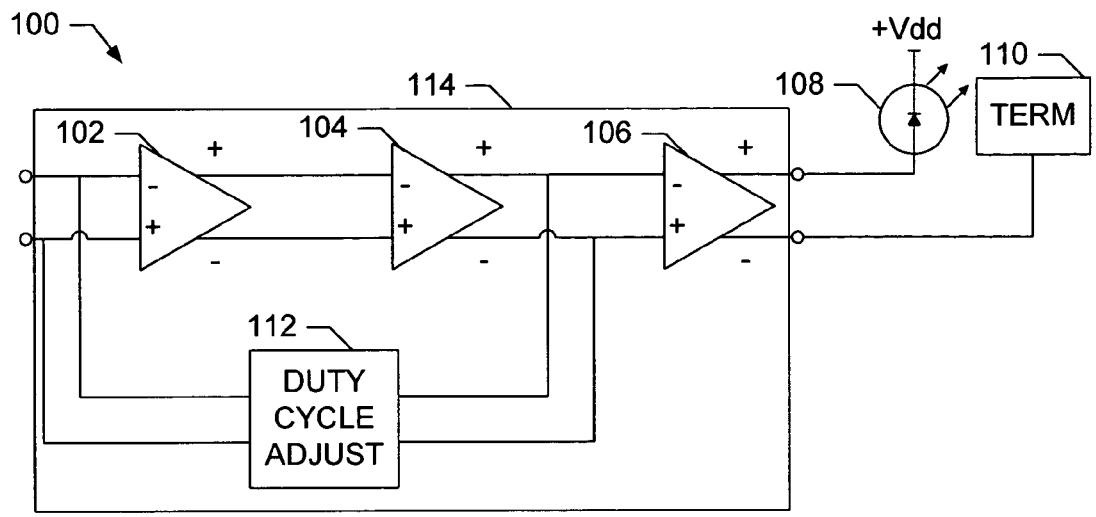
FIG. 1 is a schematic diagram of a known driver system.
Figure 2:
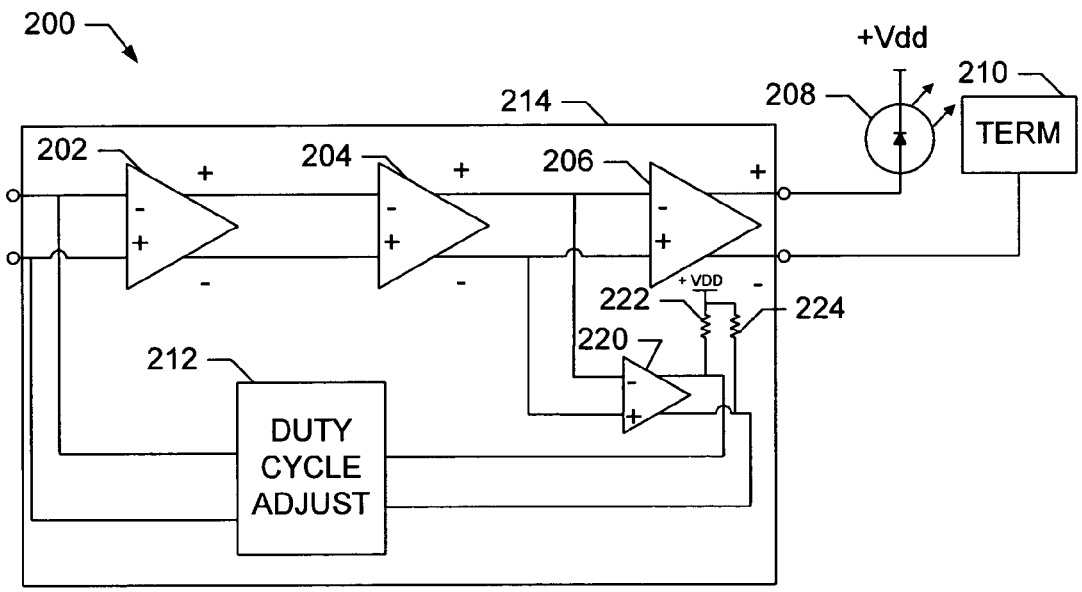
FIG. 2 is a schematic diagram of a driver system.

As shown in FIG. 2, a driver system 200 includes first and second driver stages 202, 204 that are cascaded to an output stage 206. An input signal may be provided to the first driver stage 202 and a driving signal may be coupled from the output stage 206 to a laser 208 and a termination 210. The driver system 200 also includes a DCA circuit 212. The first and second driver stages 202, 204, the output stage 206 and the DCA circuit 212 are each disposed on a chip 214. The DCA circuit 212 receives an input from a replica output stage 220 having pull-up resistors 222, 224 coupled to the differential outputs thereof. The arrangement of FIG. 2 provides a differential feedback signal regardless of whether the output stage 206 is AC or direct coupled to the laser 208 and also provides an output stage 206 having an open drain or open collector output.

The laser 208 may be implemented using, for example, a laser diode, a vertical cavity surface emitting lasers (VCSEL) or a physical media dependent (PMD) laser. Regardless of the type of the laser used, the driver system 200 is configured to provide a feedback signal to the DCA circuit 212 that is an accurate representation of the duty cycle of the voltage produced by the output stage 206.

The DCA circuit 212 may be implemented using any conventional mark/space circuit that compares the DC levels of two feedback signals. For example, as shown in FIG. 2, the DCA circuit 212 compares the DC levels provided by the outputs from the replica output stage 220. Based on the DC levels of the signals from the replica output stage 220, the DCA circuit 212 outputs a duty cycle correction signal that varies the duty cycle of signals provided to the first driver stage 202. Changing the duty cycle of the signals provided to the first driver stage 202 in turn affects the duty cycle output from the first driver stage 202, the second driver stage 204, the output stage 206 and the replica output stage 220, the output of which is, for duty cycle purposes, identical or nearly identical to the output from the output stage 206.

The replica output stage 220, like the output stage 206, receives its input from the output of the second driver stage 204. The replica output stage 220 has identical or nearly identical duty cycle characteristics as the output stage 206, but the replica output stage 220 consumes far less current than the output stage 206 because the replica output stage 220 is not required to have significant power driving capability. Accordingly, the replica output stage 220 behaves, with respect to duty cycle properties, identically or nearly identically to the output stage 206 so that the DCA circuit 212 can accurately control the duty cycle of the signals coupled from the output stage 206, regardless of the coupling or the termination (i.e., the loading) of the output stage 206.

The first and second driver stages 202, 204, the output stage 206 and the replica output stage 220 may be integrated onto a single substrate using semiconductor fabrication techniques. For example, the first and second driver stages 202, 204, the output stage 206 and the replica output stage 220 may be integrally formed on a substrate (e.g., silicon, gallium arsenide (GaAs), etc.) using doping techniques.

In terms of power and current handling capability, the replica output stage 220 is configured to operate using far less current than is used by the output stage 206. For example, while the output stage 206 may be designed to source a drive current of, for example, 100 milliamperes (mA), the replica output stage 220 may be configured to consume $\frac{1}{100}^{th}$ of such a current and, therefore, may operate using 1 mA of current. As a further example, the output stage 206 may be designed to source a drive current of 100 mA and the replica output stage 220 may be configured to consume $\frac{1}{10}^{th}$ of such current and, therefore, may operate using 10 mA of current.

In implementation, it is desirable to have the replica output stage 220 located as closely as possible to the output stage 206 to maximize the similarity between the duty cycle characteristics of the replica output stage 220 and the output stage 206. For example, the replica output stage 220 and the output stage 206 may have identical or nearly identical switching and transient characteristics to ensure that the duty cycle behaviors of the replica output stage 220 and the output stage 206 are similar or identical.

As will be readily appreciated by those having ordinary skill in the art, one or more of the first and second driver stages 202, 204 could be eliminated. For example, referring to FIG. 2, the first driver stage 202 could be eliminated and the signals from the DCA circuit 212 could be coupled to the input of the second driver stage 204. As a further example, both of the first and second driver stages 202, 204 could be eliminated and the output of the DCA circuit 212 could be coupled directly to the input to the output stage 206. Such an arrangement is possible due to the presence of the replica output stage 220, which has duty cycle characteristics similar or identical to those of the output stage 206.

Figure 3:
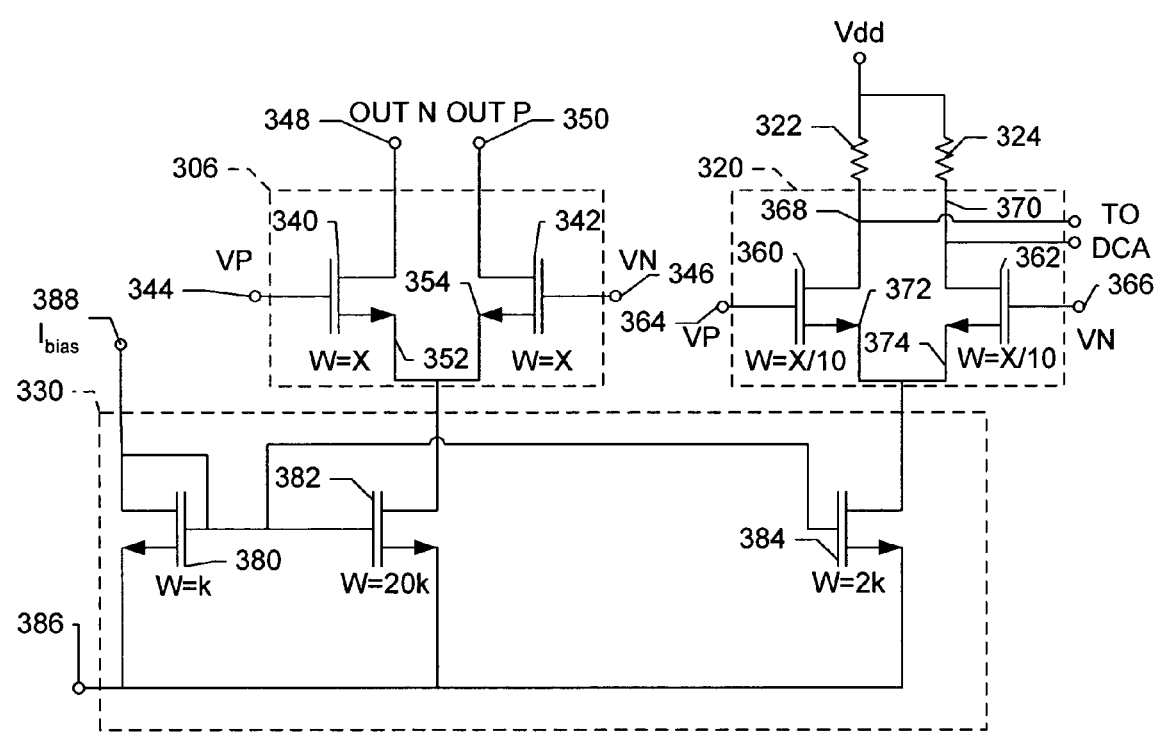
FIG. 3 is a circuit diagram of the output stage and the replica output stage of driver system of FIG. 2.

As shown in the example of FIG. 3, an output stage 306, a replica output stage 320 (having associated bias resistors 322 and 324) and a bias circuit 330 may be fabricated from transistors, such as field effect transistors (FETs) or bi-polar junction transistors (BJTs). If used, the FETs could be junction field effect transistors (JFETS), metal-oxide semiconductor field effect transistors (MOSFETs) (such as P-channel or N-channel MOSFETs), or any other suitable transistors. As described in detail below, the current and power consumption associated with the replica output stage 320 is significantly lower than the current and power consumption of the output stage 306. However, the duty cycle characteristics of the replica output stage 320 are identical or nearly identical to the duty cycle characteristics of the output stage 306.

The output stage 306 includes first and second transistors 340, 342, having input terminals 344, 346 that function as positive and negative input terminals, respectively. The terminals 348 and 350 of the first and second transistors 340, 342 form negative and positive differential output terminals, respectively. The terminals 348, 350 of the first and second transistors 340, 342 are not terminated on-chip and, therefore, are referred to as having open drain (if the transistors 340, 342 are FETs) or open collector outputs (if the transistors are BJTs). The terminals 352, 354 of the first and second transistors 340, 342 are coupled together and further coupled to the bias circuit 330.

The replica output stage 320 includes first and second transistors 360, 362 having input terminals 364, 366 that function as positive and negative input terminals, respectively, and that are connected in parallel with the positive and negative input terminals 344 and 346 of the output stage 306 (although such connections are not shown in FIG. 3 for the purpose of clarity). The terminals 368, 370 of the first and second transistors 360, 362 are coupled to the pull up resistors 322, 324 (having, for example, values of 250 ohms), respectively, which are coupled to a voltage source Vdd. Additionally, the terminals 368, 370 provide signals that are coupled to a DCA circuit. The terminals 372, 374 of the first and second transistors 360, 362 are coupled together and further coupled to the bias circuit 330. In practice, it is desirable to locate the output stage 306 and the replica output stage 320 physically close to one another so that the duty cycle characteristics of the two are as similar as possible.

The bias circuit 330 includes first, second and third transistors 380, 382, 384, the source terminals of which are all coupled together at a terminal 386. The gates of each of the first, second and third transistors 380, 382 and 384 are coupled together, and the gate and the drain of the first transistor 380 are coupled together at a terminal 388 to which a bias current ($i_{bias}$) is applied. The drain of the second transistor 382 is coupled to the output stage 306 and the drain of the third transistor 384 is coupled to the replica output stage 320. Commonly, the bias circuit configuration of FIG. 3 is referred to as a current mirror.

As will be appreciated by those having ordinary skill in the art, the power and current handling capabilities of transistors are related to the widths of the channels used to implement the transistors. The narrower the width of the transistor channels, the less current the device can carry. For example, a transistor specified to have a width of five units (e.g., five micrometers, microns, etc.) can pass five times the amount of current that a transistor specified to have a width of one unit, under identical conditions.

Reference will now be made to the relationships of the widths of the transistors 340, 342, 360 and 362 in the output stage 306 and the replica output stage 320. As shown in FIG. 3, the widths of the transistors 360 and 362 of the replica output stage 320 are one-tenth the widths of the transistors 340, 342 of the output stage 306. Accordingly, based on the relationship of the transistors 340, 342 and 360, 362, the replica output stage 320 can consume only one-tenth the current that can be consumed by the output stage 306.

With regard to the relationships between the widths of the first, second and third transistors 380, 382 and 384. The widths of the second and third transistors 382, 384 are twenty and two times, respectively, the width of the first transistor 380. Accordingly, while the first transistor 380 can pass a given amount of current and is used to set the gate voltages of the second and third transistors 382, 384, the second transistor 382, which provides a current path for the output stage 306, is capable of passing twenty times the amount of current that the first transistor 380 can pass. The third transistor 384, which has a width of two times that of the first transistor 380, can pass one-tenth the current that can be passed by the second transistor 382. Because the third transistor 384 is coupled to the replica output stage 320, which has a current handling capability of one-tenth of that of the output stage 306, the output stage 306 and its associated current path (the second transistor 382) can pass 10 times the current that the replica output stage 320 and its associated current path (the third transistor 384) can pass.

Although the foregoing discloses example systems including, among other components, transistors connected to form circuits, it should be noted that such systems are merely illustrative and should not be considered as limiting. For example, it is contemplated that any or all of these transistors could be embodied in discrete devices connected together using a circuit board or numerous ones of the transistors could be integrated together on one or multiple portions of silicon or any other suitable substrate. Accordingly, while the foregoing describes example systems, persons of ordinary skill in the art will readily appreciate that the examples are not the only way to implement such systems.

What is claimed is:

1. A driver circuit comprising:
a duty cycle adjustment circuit;
an output stage configured to receive an input signal having a duty cycle; and
a replica output stage configured to receive the input signal and to produce an output signal that is coupled to the duty cycle adjustment circuit, wherein the duty cycle adjustment circuit is configured to affect the duty cycle of the input signal, wherein the output stage is configured to consume a first amount of current and the replica output stage is configured to consume a second amount of current that is less than the first amount of current.

2. A driver circuit as defined by claim 1, wherein the replica output stage includes a duty cycle characteristic that is similar to a duty cycle characteristic of the output stage.

3. A driver circuit as defined by claim 1, wherein the output stage is configured to be terminated by circuit separate from the output stage.

4. A driver circuit as defined by claim 1, wherein the output stage includes transistors.

5. A driver circuit as defined by claim 4, wherein the transistors are selected from a group consisting of field effect transistors and bipolar junction transistors.

6. A driver circuit as defined by claim 4, wherein the transistors comprise metal-oxide semiconductor field effect transistors.

7. A driver circuit as defined by claim 4, wherein the replica output stage includes transistors.

8. A driver circuit as defined by claim 7, wherein the transistors of the output stage and the replica output stage comprise discrete components.

9. A driver circuit as defined by claim 7, wherein the transistors of the output stage and the replica output stage are integrated on a substrate.

10. A driver circuit comprising:
a duty cycle adjustment circuit;
an output stage configured to receive an input signal having a duty cycle, wherein the output stage includes transistors; and
a replica output stage configured to receive the input signal and to produce an output signal that is coupled to the duty cycle adjustment circuit, wherein the duty cycle adjustment circuit is configured to affect the duty cycle of the input signal, wherein the replica output stage includes transistors; and
a bias circuit coupled to the output stage and the replica output stage, wherein the bias circuit is configured to provide more current for the output stage than for the replica output stage.

11. A driver circuit comprising:
a duty cycle adjustment circuit;
an output stage configured to receive an input signal having a duty cycle;
a replica output stage configured to receive the input signal and to produce an output signal that is coupled to the duty cycle adjustment circuit, wherein the duty cycle adjustment circuit is configured to affect the duty cycle of the input signal; and
a driver stage coupled to the output stage, wherein the driver stage includes an output configured to produce the input signal coupled to the output stage and wherein the driver stage further includes an input coupled to the duty cycle adjustment circuit and configured to receive a duty cycle adjustment signal therefrom.

12. A method of controlling a duty cycle of an output signal, the method comprising:
providing input signal to an output stage, wherein the output stage comprises a first duty cycle characteristic;
providing the input signal to a replica output stage, wherein the replica output stage comprises a second duty cycle characteristic similar to the first duty cycle characteristic and wherein the replica output stage produces a replica output signal;
coupling the replica output signal from the replica output stage to a duty cycle control circuit that compares a duty cycle of the replica output signal from the replica output stage to a desired duty cycle and outputs a duty cycle correction signal; and
coupling the duty cycle correction signal from the duty cycle control circuit to a circuit that feeds the input signal to the output stage and the replica output stage, wherein the output stage is configured to consume a first amount of current and the replica output stage is configured to consume a second amount of current that is less than the first amount of current.

13. A method as defined by claim 12, wherein the replica output stage includes a duty cycle characteristic that is similar to a duty cycle characteristic of the output stage.

14. A method as defined by claim 12, wherein the output stage is configured to be terminated by circuit separate from the output stage.

15. A method of controlling a duty cycle of an output signal, the method comprising:
providing input signal to an output stage, wherein the output stage comprises a first duty cycle characteristic;
providing the input signal to a replica output stage, wherein the replica output stage comprises a second duty cycle characteristic similar to the first duty cycle characteristic and wherein the replica output stage produces a replica output signal;
coupling the replica output signal from the replica output stage to a duty cycle control circuit that compares a duty cycle of the replica output signal from the replica output stage to a desired duty cycle and outputs a duty cycle correction signal; and
coupling the duty cycle correction signal from the duty cycle control circuit to a circuit that feeds the input signal to the output stage and the replica output stage; and
providing a first bias current to the output stage and providing a second bias current to the replica output stage, wherein a magnitude of the first bias current is larger than a magnitude of the second bias current.

16. A circuit comprising:
a driver stage having an input and an output;
an output stage coupled to the output of the driver stage and configured to receive an input signal having a duty cycle therefrom, wherein the output stage is configured to produce an output signal;
a laser diode coupled to the output stage and configured to receive the output signal;
a replica output stage coupled to the driver stage, wherein the replica output stage is configured to receive the input signal from the driver stage and to produce a replica output signal; and
a duty cycle adjustment circuit coupled to the input of the driver stage and the replica output stage, wherein the duty cycle adjustment circuit is configured to receive the replica output signal and to produce a duty cycle correction signal that is coupled to the input of the driver stage.

17. A circuit configuration as defined by claim 16, wherein the replica output stage includes a duty cycle characteristic that is similar to a duty cycle characteristic of the output stage.

18. A circuit configuration as defined by claim 16, wherein the output stage is configured to consume a first amount of current and the replica output stage is configured to consume a second amount of current that is less than the first amount of current.

* * * * *